US011075085B2

(12) United States Patent
Nishitani et al.

(10) Patent No.: US 11,075,085 B2
(45) Date of Patent: Jul. 27, 2021

(54) WAFER POLISHING METHOD

(71) Applicant: SUMCO CORPORATION, Tokyo (JP)

(72) Inventors: Takashi Nishitani, Tokyo (JP); Ryuichi Tanimoto, Tokyo (JP)

(73) Assignee: SUMCO CORPORATION, Tokyo (JP)

(*) Notice: Subject to any disclaimer, the term of this patent is extended or adjusted under 35 U.S.C. 154(b) by 461 days.

(21) Appl. No.: 15/776,266

(22) PCT Filed: Nov. 4, 2016

(86) PCT No.: PCT/JP2016/082763
§ 371 (c)(1),
(2) Date: May 15, 2018

(87) PCT Pub. No.: WO2017/090406
PCT Pub. Date: Jun. 1, 2017

(65) Prior Publication Data
US 2019/0333775 A1    Oct. 31, 2019

(30) Foreign Application Priority Data

Nov. 26, 2015   (JP) .............................. JP2015-230350

(51) Int. Cl.
*H01L 21/306* (2006.01)
*B24B 37/013* (2012.01)
(Continued)

(52) U.S. Cl.
CPC ...... *H01L 21/30625* (2013.01); *B24B 37/013* (2013.01); *B24B 37/30* (2013.01); *B24B 49/12* (2013.01); *H01L 22/12* (2013.01)

(58) Field of Classification Search
CPC ............... H01L 21/30625; H01L 22/12; H01L 21/0274; H01L 21/304; B24B 37/005;
(Continued)

(56) References Cited

U.S. PATENT DOCUMENTS 7,131,891 B2 * 11/2006 Elledge .................. B24B 37/30
451/11
7,930,058 B2 * 4/2011 Bhagavat ................ B24B 51/00
700/164
(Continued)

FOREIGN PATENT DOCUMENTS

JP      2006-524588      11/2006
JP      2007-095987       4/2007
(Continued)

OTHER PUBLICATIONS

Official Communication issued in WIPO Patent Application No. PCT/JP2016/082763, dated Dec. 20, 2016.

*Primary Examiner* — Monica S Carter
*Assistant Examiner* — Alberto Saenz
(74) *Attorney, Agent, or Firm* — Greenblum & Bernstein, P.L.C.

(57) ABSTRACT

A wafer polishing method of applying mirror polishing to a surface of a wafer using a wafer polishing apparatus provided with a multi-zone pressurizing polishing head having a wafer pressing surface divided into a plurality of pressure zones and capable of performing pressurizing control independently for each pressure zone is provided with a measurement step of measuring a nanotopography map on the wafer surface; and a polishing step of performing the polishing by setting the polishing pressure of the polishing head against the wafer for each pressure zone based on a result of the measurement of the nanotopography map.

9 Claims, 6 Drawing Sheets

(51) Int. Cl.
*B24B 37/30* (2012.01)
*B24B 49/12* (2006.01)
*H01L 21/66* (2006.01)

(58) Field of Classification Search
CPC ......... B24B 37/013; B24B 37/30; B24B 1/00;
B24B 49/12; B24B 37/042; B24B 49/02;
B24B 49/04; B24B 49/16
USPC .... 451/5, 283, 284, 285, 286, 287, 6, 9, 10, 451/11
See application file for complete search history.

(56) References Cited

U.S. PATENT DOCUMENTS

| | | |
|---|---|---|
| 2001/0007810 A1 | 7/2001 | Moloney et al. |
| 2004/0214509 A1 | 10/2004 | Elledge |
| 2007/0167110 A1* | 7/2007 | Tseng ..................... B24B 37/30 451/5 |
| 2007/0190909 A1 | 8/2007 | Muldowney |
| 2008/0166948 A1 | 7/2008 | Bhagavat et al. |
| 2011/0097974 A1 | 4/2011 | Schwandner et al. |
| 2014/0273749 A1 | 9/2014 | Qian et al. |

FOREIGN PATENT DOCUMENTS

| | | |
|---|---|---|
| JP | 2010-120160 | 6/2010 |
| JP | 2011-103460 | 5/2011 |
| JP | 2012-235072 | 11/2012 |
| TW | 201503244 | 1/2015 |

\* cited by examiner

PRIOR ART

| | (a) | (b) |
|---|---|---|
| Nanotopography | Not existing | Protruding toward the polishing surface side |
| Shape of the wafer before mashining (same flatness level) |  |  |
| Polishing pressure image (same pressure level) |  |  |
| Shape of the wafer after mashining |  |  |

WAFER POLISHING METHOD

TECHNICAL FIELD

The present invention relates to a wafer polishing method and, more particularly, to a wafer polishing method for a wafer having a surface on which nanotopography is formed.

BACKGROUND ART

Silicon wafers are widely used as a substrate material for semiconductor devices. Silicon wafers are manufactured by sequentially applying processes such as outer periphery grinding, slicing, lapping, etching, double-side polishing, single-side polishing, cleaning, etc., to a silicon single crystal ingot. Among the above processes, the single-side polishing process is a process required in order to remove unevenness or waviness of the wafer surface and thus to enhance flatness, in which mirror finishing by CMP (Chemical Mechanical Polishing) method is performed.

Typically, in the single-side polishing process for a silicon wafer, a single wafer polishing apparatus (CMP apparatus) is used. The wafer polishing apparatus includes a rotating platen to which a polishing pad is affixed and a polishing head that holds a wafer on the polishing pad while pressing the wafer. The apparatus polishes one surface of the wafer by rotating the rotating platen and polishing head while feeding slurry.

There is known a wafer polishing apparatus developed for enhancement of wafer flatness. To this end, the apparatus is provided with a multi-zone pressurizing polishing head having a wafer pressing surface divided into a plurality of pressure zones and capable of performing pressurizing control independently for each pressure zone. For example, Patent Document 1 describes a wafer polishing apparatus having first to third pressure zones (pressure chambers) sectioned concentrically.

In recent years, silicon wafers have a problem of a surface waviness component called "nanotopography". The nanotopography refers to a waviness component having a wavelength $\lambda=0.2$-20 mm shorter than "curve" or "warpage" and longer than "surface roughness" and having a PV (Peak to Valley) value which is as small as 0.2 μm or less. When the nanotopography value exceeds an appropriate value, yield of STI (Shallow Trench Isolation) in a device process is said to be significantly affected.

Further, for example, Patent Document 2 describes a wafer grinding method developed for improving the wafer nanotopography. The method includes previously calculating a relational expression between the unevenness amount of the average value component of the nanotopography and the tilt adjustment amount and the shift adjustment amount of a grinding stone for flattening the unevenness, and performing, based on the relational expression, the tilt adjustment and the shift adjustment of the grinding stone in the subsequent grinding process.

CITATION LIST

Patent Document

[Patent Document 1] Japanese Patent Application Laid-Open No. 2010-120160
[Patent Document 2] Japanese Patent Application Laid-Open No. 2007-95987

SUMMARY OF THE INVENTION

Problem to be Solved by the Invention

Conventional wafer polishing apparatuses adopting the multi-zone pressurizing system set a polishing pressure by taking the surface of a wafer that faces a polishing pad as a reference and adjusts a polishing pressure in each pressure zone in accordance with the thickness of the wafer so as to increase the polishing pressure at a large thickness part of the wafer, thus making it possible to remove unevenness or waviness of the wafer surface to thereby enhance flatness.

However, in the conventional wafer polishing apparatuses, even when a uniform polishing pressure is set for each pressure zone, a polishing pressure different from the set value is applied to a region where the nanotopography exists, thus degrading the uniformity of wafer thickness. As illustrated in FIG. 6A, in a wafer having no nanotopography, a uniform pressure which is the same value as the set value is applied to the entire wafer surface, so that the uniformity of the wafer thickness before machining can be maintained even after machining. However, as illustrated in FIG. 6B, when the nanotopography exists on the wafer surface, a polishing pressure different from the set value is applied to the backside surface of the wafer even when the uniformity of the wafer thickness is the same as that in the wafer of FIG. 6A. When the wafer is polished in this state, the polishing pressure concentrates on the convex part of the wafer surface. It follows that the polishing rate at a part applied with a high polishing pressure is increased. As a result, the wafer thickness after machining becomes non-uniform, degrading the wafer flatness.

The object of the present invention is therefore to provide a wafer polishing method capable of applying an adequate polishing pressure for each pressure zone by suppressing the influence of the nanotopography and thereby enhancing the wafer flatness.

Means for Solving the Problem

To solve the above problem, according to the present invention, there is provided a wafer polishing method of applying mirror polishing to a surface of a wafer using a wafer polishing apparatus provided with a multi-zone pressurizing polishing head having a wafer pressing surface divided into a plurality of pressure zones and capable of performing pressurizing control independently for each pressure zone, including a measurement step of measuring a nanotopography map on the wafer surface and a polishing step of performing the polishing by setting the polishing pressure of the polishing head against the wafer for each pressure zone based on a result of the measurement of the nanotopography map.

When the mirror polishing is applied to the wafer by using the multi-zone pressurizing polishing head, polishing pressure is controlled according to the thickness of the wafer with the wafer surface set as a reference, so that the wafer may be excessively polished in a site having a large nanotopography value and may thus degrade the uniformity of wafer thickness, which in turn may cause degradation in wafer flatness. However, according to the present invention, an increase in the polishing pressure in a site having a large nanotopography value can be suppressed. Thus, it is possible to prevent degradation in wafer thickness uniformity caused by an increase in removal amount, thereby enhancing wafer flatness.

The wafer polishing method according to the present invention preferably controls the polishing pressure such that a lower polishing pressure is applied to a site having a larger nanotopography value. By thus making the polishing pressure inversely proportional to the size of the nanotopography, that is, by applying a lower polishing pressure to a site with a larger height difference between the top and the bottom of the convex portion of the nanotopography, an increase in the polishing pressure in a site having a large nanotopography value can be suppressed. Thus, it is possible to prevent degradation in wafer thickness uniformity caused by an increase in removal amount, thereby enhancing wafer flatness.

The wafer polishing method according to the present invention preferably prepares a conversion formula defining the relationship between the nanotopography size and an adequate polishing pressure against a wafer having the nanotopography and calculates the polishing pressure in each pressure zone from the measurement result of the nanotopography map and the conversion formula. By using the conversion formula defining an adequate polishing pressure corresponding to the nanotopography size, it is possible to easily calculate an adequate polishing pressure in each pressure zone with less computational complexity from the measurement result of the nanotopography map.

The wafer polishing method according to the present invention preferably calculates the polishing pressure in one pressure zone from the average value of a plurality of site nanotopographies belonging to the one pressure zone. In this case, the polishing pressure calculated from the average value of the plurality of site nanotopographies in the one pressure zone may be set as the polishing pressure for the one pressure zone. Alternatively, the average value of a plurality of polishing pressures calculated from the respective site nanotopographies in one pressure zone may be set as the polishing pressure for the one pressure zone. In either case, an adequate polishing pressure can be set in each pressure zone, so that it is possible to prevent degradation in wafer thickness uniformity caused by an increase in removal amount, thereby enhancing wafer flatness.

In the present invention, the plurality of pressure zones is preferably sectioned concentrically. Many of the nanotopographies formed in a lapping process have a ring-shaped pattern. By arranging the pressure zones of the polishing head concentrically, it is possible to set an adequate polishing pressure corresponding to the ring-shaped nanotopography pattern.

Advantageous Effects of the Invention

Thus, according to the present invention, it is possible to provide a wafer polishing method capable of applying an adequate polishing pressure for each pressure zone by suppressing the influence of the nanotopography and thereby enhancing wafer flatness.

BRIEF DESCRIPTION OF DRAWINGS

FIG. 1A is a cross-sectional view, and FIG. 1B is a bottom view of a membrane constituting the pressing surface of a wafer;

FIG. 5A illustrates a case where a wafer is polished by the conventional pressurizing control system, and FIG. 5B illustrates a case where a wafer is polished by the pressurizing control system according to the present invention.

DETAILED DESCRIPTION OF THE EMBODIMENTS

A preferred embodiment of the present invention will be described in detail below with reference to the accompanying drawings.

Figure 1A:
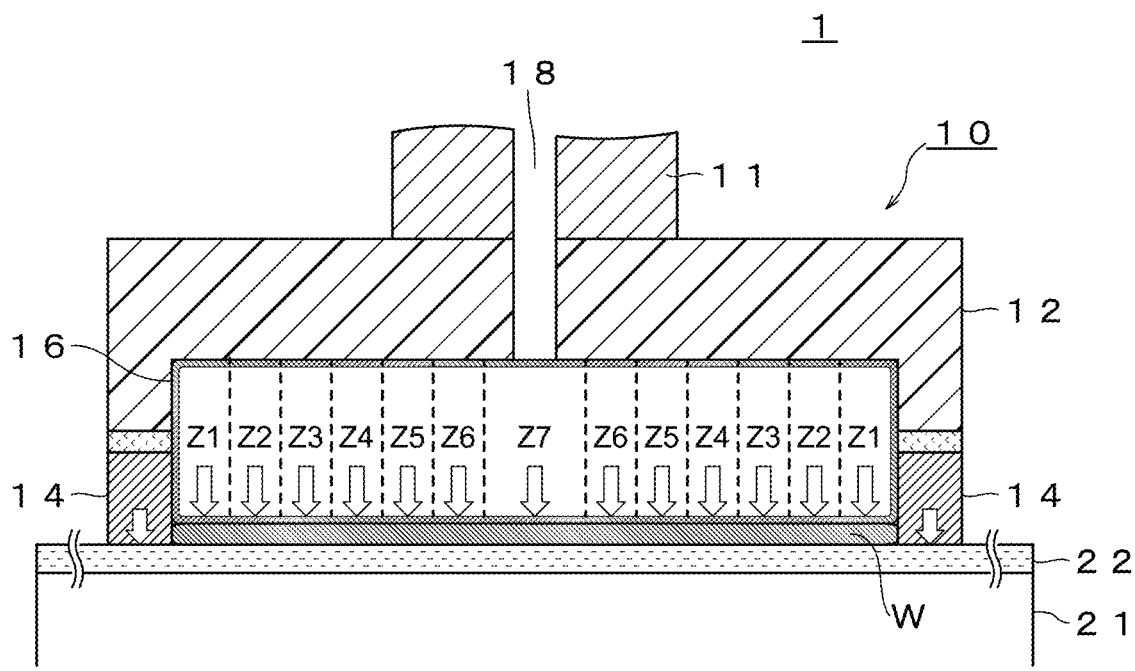
FIGS. 1A and 1B are views schematically illustrating the configuration of a wafer polishing apparatus according to an embodiment of the present invention and, specifically.
Figure 1B:
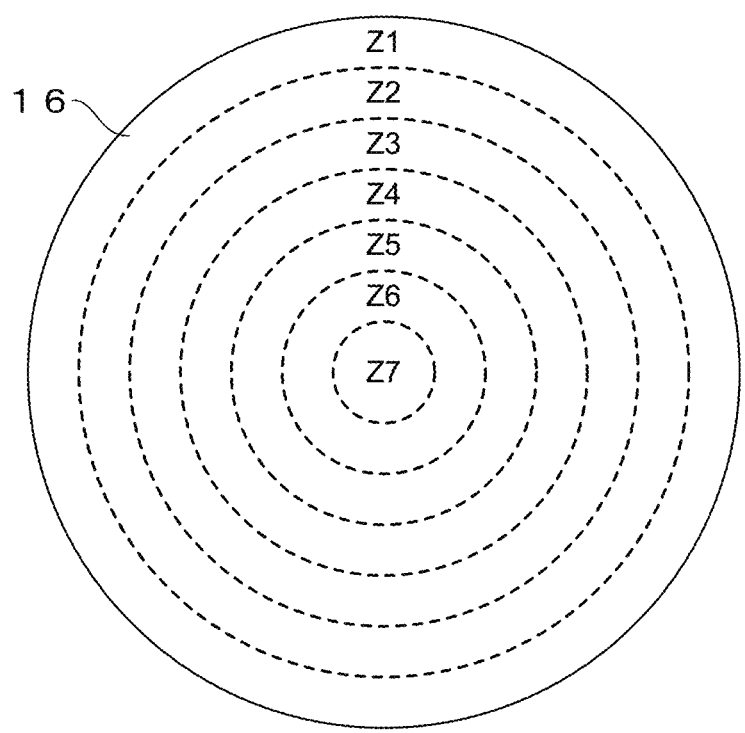

FIGS. 1A and 1B are views schematically illustrating the configuration of a wafer polishing apparatus according to an embodiment of the present invention. FIG. 1A is a cross-sectional view, and FIG. 1B is a bottom view of a membrane constituting the pressing surface of a wafer.

As illustrated in FIGS. 1A and 1B, a wafer polishing apparatus 1 has a rotating platen 21 to which a polishing pad 22 is affixed and a multi-zone pressurizing polishing head 10 that holds a wafer W placed on the rotating platen 21 while pressing the wafer W. The main surface of the rotating platen 21 to which the polishing pad 22 is affixed faces the pressing surface of the polishing head 10 and has a planar size sufficiently larger than that of the pressing surface. By rotating the rotating platen 21 and polishing head 10 while supplying slurry onto the polishing pad 22, one surface of the wafer W contacting the polishing pad 22 can be polished.

The polishing head 10 has a rotary shaft 11, a pressurization flange 12 provided at the lower end of the rotary shaft 11, a retainer ring 14 with an independent pressurizing system provided at the bottom surface of the pressurization flange 12, and a membrane 16 attached to the pressurization flange 12. The polishing head 10 constitutes a wafer pressurizing mechanism that pressurizes the wafer W through the membrane 16 by air.

The retainer ring 14 is a guide member provided at the outer peripheral portion of the bottom surface of the pressurization flange 12. Like the membrane 16, the retainer ring 14 is configured to be able to press the upper surface of the polishing pad 22, and the bottom surface of the retainer ring 14 is brought into contact with (grounded to) the polishing pad 22. The bottom surface of the retainer ring 14 is brought into press contact with the polishing pad 22, so that horizontal movement of the wafer W can be reliably restricted, thereby making it possible to prevent the wafer from slipping out the polishing head 10. The polishing head 10 provided with such an independently pressurizing retainer ring 14 presses the wafer while maintaining the shape of the wafer, so that polishing pressure is susceptible to nanotopography on the wafer surface.

The bottom surface of the membrane 16 contacts the entire backside surface (upper surface) of the wafer. The membrane 16 is connected to a membrane pressurization line 18, whereby air is fed inside the membrane 16. The air is fed inside the membrane 16 from the membrane pressurization line 18 to expand the membrane 16, whereby the wafer W is pressed downward. The internal space of the membrane 16 is divided into a plurality of pressure zones, and pressure in each pressure zone is individually controlled by the air fed from the membrane pressurization line 18 to the membrane 16. Although not particularly limited, in the present embodiment, concentrically-sectioned first to seventh pressure zones Z1 to Z7 are provided as illustrated in FIG. 1B. By individually setting the pressure of the air fed to each of the pressure zones Z1 to Z7, an adequate pressing force corresponding to the uneven surface shape of the wafer W is applied to the wafer W contacting the membrane 16.

Figure 2:
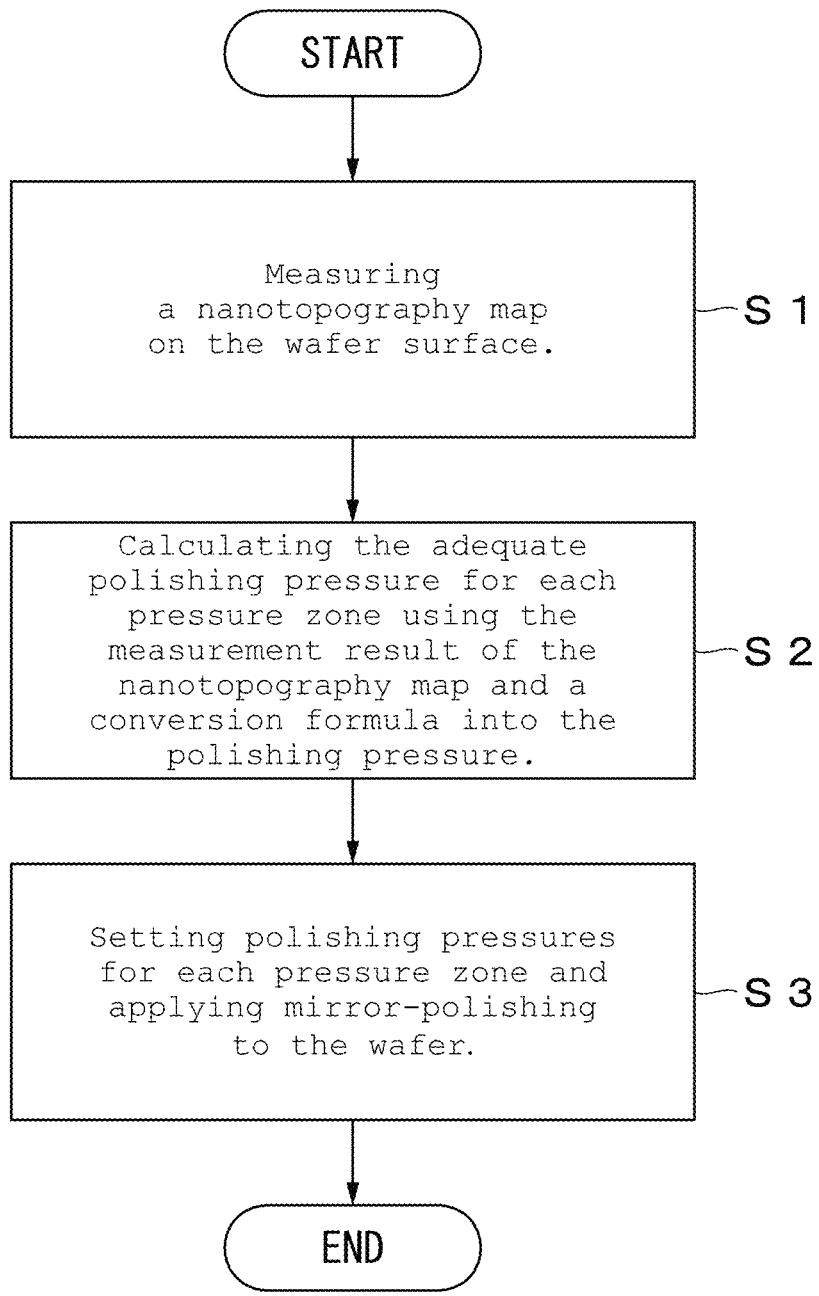
FIG. 2 is a flowchart for explaining a wafer polishing method using the wafer polishing apparatus illustrated in FIGS. 1A and 1B.

FIG. 2 is a flowchart for explaining a wafer polishing method using the wafer polishing apparatus 1 illustrated in FIGS. 1A and 1B.

As illustrated in FIG. 2, a wafer polishing method according to the present embodiment includes, prior to a process of applying mirror-polishing to the wafer while pressing the wafer with the multi-zone pressurizing polishing head 10, measuring a nanotopography map on the wafer surface, calculating an adequate wafer polishing pressure for each pressure zone from a result of the measurement, and performing the polishing process while controlling the wafer polishing pressure using a result of the calculation. To this end, first, the nanotopography map on the surface of the wafer to be machined is measured (step S1).

The wafer W to be machined is a wafer cut out by a wire saw from a silicon single crystal ingot grown by the CZ method and then subjected to lapping (double-side grinding). The nanotopography is formed during the wafer machining process (slicing to polishing). When the wafer having nanotopography is subjected to single-side polishing by using the multi-zone pressurizing polishing head, the uniformity of wafer thickness may be degraded.

The nanotopography map can be measured by using optical interference type flatness/nanotopography measurement devices. These devices are of an optical type and configured to measure the nanotopography by utilizing surface reflection of the wafer. In-plane data of the silicon wafer captured by a Michelson interferometer is subjected to noise removal. Then, a window size determined by settings is moved in the wafer plane, and the PV value in the window is replaced with the center value of the window, whereby data of the nanotopography is obtained.

Figure 3:
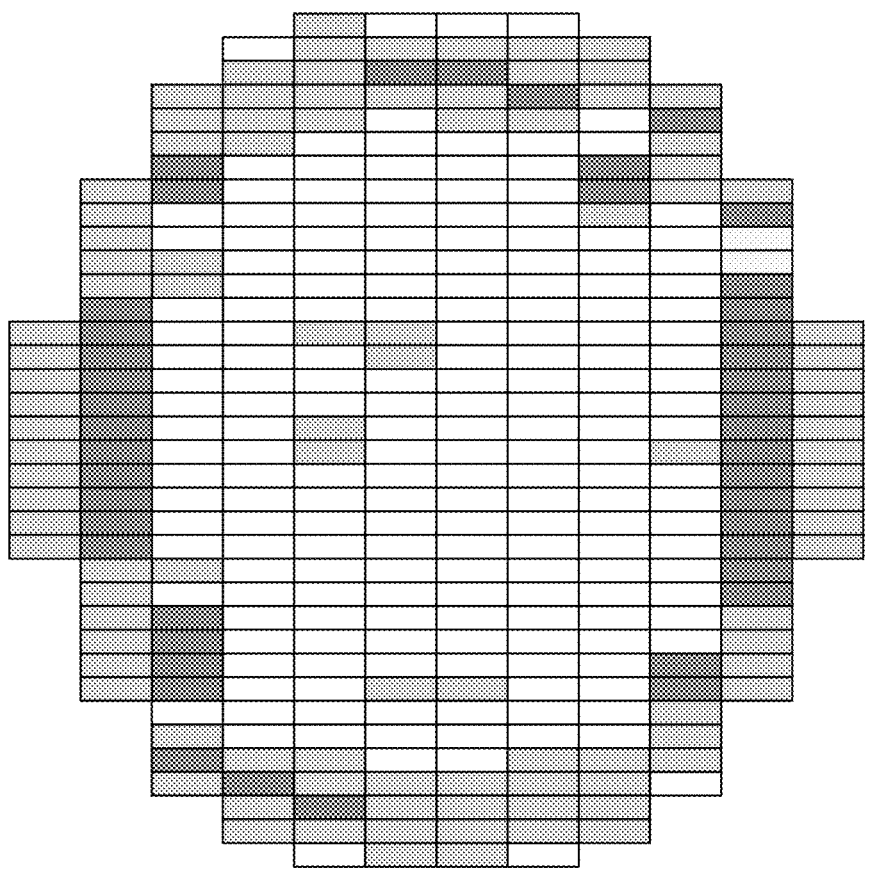
FIG. 3 is a view illustrating an example of the nanotopography map.

FIG. 3 is a view illustrating an example of the nanotopography map.

As illustrated in FIG. 3, the nanotopography map represents an intensity distribution of the nanotopography in a wafer plane and, specifically, shows the size (magnitude) of the nanotopography (site nanotopography) in each of the sites divided into lattice cells. In FIG. 3, the size of the site nanotopography is displayed by color classification, wherein a site with the lightest color indicates a small deviation (0 nm to 8 nm) from a reference plane, a site with the second lightest color indicates a larger deviation (8 nm to 12 nm) from the reference plane, and a site with the darkest color indicates a still larger deviation (12 nm to 15 nm) from the reference plane. The nanotopography map of FIG. 3 represents a wafer having a large deviation at its outer peripheral portion. That is, a ring-shaped nanotopography pattern is formed in the wafer represented by the nanotopography map of FIG. 3. It is known that, in most cases, such a ring-shaped nanotopography pattern is formed in the wafer lapping process.

Then, the polishing pressure in the wafer plane is calculated for each pressure zone based on the measurement result of the nanotopography map (step S2 of FIG. 2). An adequate polishing pressure in each pressure zone can be calculated using a conversion formula in which the size of the site nanotopography and an adequate polishing pressure corresponding thereto are put in one-to-one correspondence. Specifically, an average value of a large number of site nanotopographies in a single pressure zone is calculated, and then a polishing pressure calculated based on the average value is used as the adequate polishing pressure in this pressure zone. Alternatively, an adequate polishing pressure in an individual site is calculated based on the value of the site nanotopography in each individual site, and then a polishing pressure converted from the average value of a large number of polishing pressures in a single pressure zone may be used as the adequate polishing pressure in this pressure zone. A previously created conversion formula can be used for calculation of an adequate polishing pressure according to the size of the site nanotopography.

Figure 4:
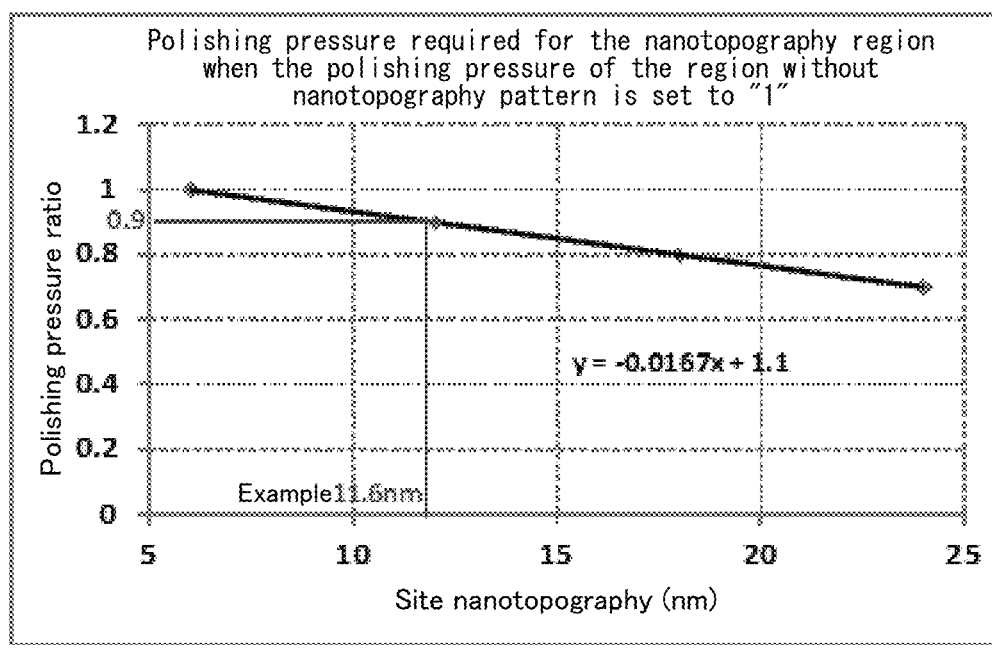
FIG. 4 is a graph illustrating an example of the conversion formula representing the relationship between the nanotopography and polishing pressure.

FIG. 4 is a graph illustrating an example of the conversion formula representing the relationship between the nanotopography and polishing pressure. The horizontal axis indicates a site nanotopography value, and the vertical axis indicates a polishing pressure ratio. The "polishing pressure ratio" represents a ratio of an adequate polishing pressure inversely proportional to the size of the nanotopography on the wafer surface to a polishing pressure required in a case where the surface of a wafer having no nanotopography is polished.

As illustrated in FIG. 4, in order to suppress influence of the nanotopography to thereby enhance wafer flatness, it is necessary to control the wafer polishing pressure such that the larger the nanotopography is, the lower the polishing pressure becomes. That is, the polishing pressure ratio needs to be a value inversely proportional to the nanotopography. For example, as illustrated, a conversion formula for calculating an adequate polishing pressure ratio y to a nanotopography value x is $y=-0.0167x+1.1$.

By calculating the polishing pressure ratio to the site nanotopography using such a conversion formula, it is possible to suppress an increase in the polishing pressure in a site having a large nanotopography value, thereby making it possible to prevent wafer flatness degradation due to an increase in removal amount.

Subsequently, the polishing pressure calculated for each pressure zone is set to each pressure zone of the membrane polishing head, and then a wafer polishing process is performed using the wafer polishing apparatus 1 (step S3 of FIG. 2). The wafer polishing apparatus 1 has the multi-zone pressurizing polishing head 10, performs polishing pressure control for each pressure zone when it performs the polishing while pressing the wafer, and previously reduces the polishing pressure at a position where the polishing pressure is supposed to be increased due to the influence of the nanotopography. Thus, it is possible to avoid the influence of the nanotopography, not allowing the wafer from being excessively polished. This secures the uniformity of wafer thickness.

As described above, the wafer polishing method according to the present embodiment sets a polishing pressure against the wafer for each pressure zone of the polishing head based on the measurement result of the nanotopography map on the wafer surface, so that it is possible to suppress an increase in the polishing pressure in a site having a large nanotopography value. This makes it possible to prevent degradation in wafer thickness uniformity caused by an increase in removal amount to thereby enhance wafer flatness. Further, the polishing pressure in each pressure zone is calculated by using a conversion formula defining the relationship between the size of the nanotopography and an adequate polishing pressure against a wafer on which the nanotopography is formed, so that it is possible to easily calculate an adequate polishing pressure in each pressure zone with less computational complexity.

While the preferred embodiment of the present invention has been described, the present invention is not limited to the above embodiment and may be variously modified without departing from the spirit of the present invention. Accordingly, all such modifications are included in the present invention.

For example, although a plurality of pressure zones are concentrically sectioned in the above embodiment, the pressure zones need not necessarily be concentrically sectioned, and may be sectioned in any shape. Further, a wafer to be polished is not limited to a silicon wafer, but wafers of various materials may be used as the wafer to be polished.

Example

What influence the pressurizing control system of the polishing head had on wafer flatness upon application of mirror polishing to a wafer having the nanotopography was evaluated. In this evaluation test, two samples of a single crystal silicon wafer (double-side polished wafer) having a diameter of 300 mm that had been subjected to double-side grinding were prepared, and the nanotopography maps of the two samples were measured. In measurement of the nanotopography map, an optical interference type flatness/nanotopography measurement device (KLA-Tencor Cooperation: "WaferSight3") was used. The site size in the wafer plane was set to 26 mm×8 mm, and the size of the nanotopography in each site was calculated and mapped.

Then, two wafer samples were subjected to mirror polishing using the pressurizing control systems based on a conventional technique and the present invention, respectively, to obtain a polished wafer sample and its comparative sample. That is, in the conventional pressurizing control system, the wafer was polished, irrespective of the nanotopography, by setting the polishing pressure using the wafer surface as a reference to obtain a polished wafer. On the other hand, as described above, in the pressurizing control system according to the present invention, the wafer polishing pressure was calculated for each pressure zone of the polishing head based on the measurement result of the nanotopography map, and the calculated polishing pressure was set for each pressure zone, followed by the polishing of the wafer, to obtain a polished wafer. As a wafer polishing apparatus, a wafer polishing apparatus provided with a multi-zone pressurizing polishing head having the first to seventh pressure zones illustrated in FIGS. 1A and 1B was used.

Thereafter, the optical interference type flatness/nanotopography measurement device (KLA-Tencor Cooperation: "WaferSight3") was used to measure an in-plane distribution of the polishing amount (removal amount) of the polished wafer.

Figure 5A:
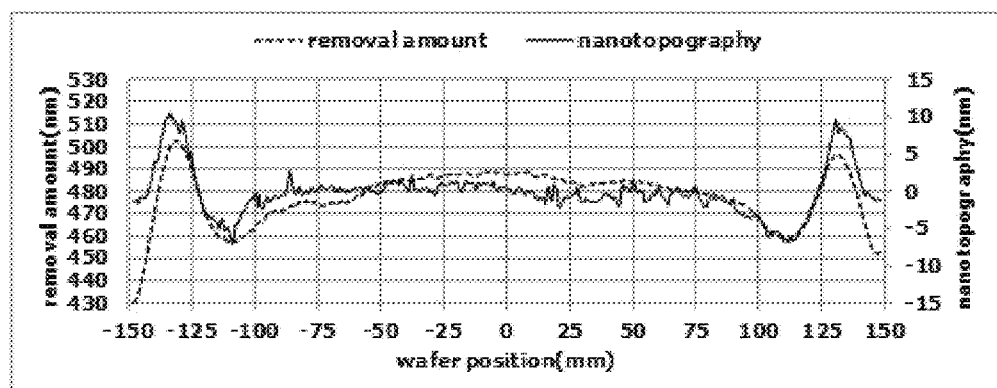
FIGS. 5A and 5B are each a graph illustrating the relationship between the nanotopography in a wafer plane and polishing amount (removal amount) and, specifically.
Figure 5B:
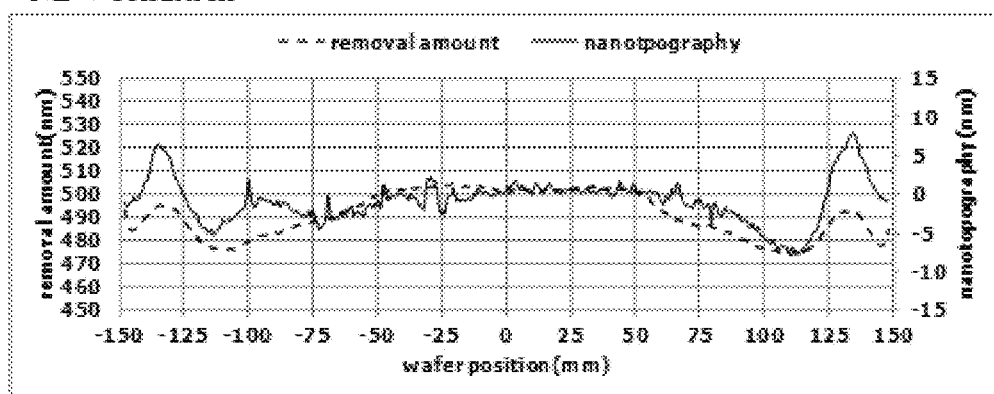
Figure 6:
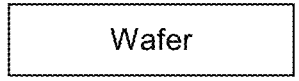
FIG. 6 is a schematic diagram for explaining the problem of the conventional wafer polishing method.
Figure 6:
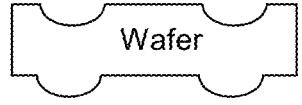
Figure 6:
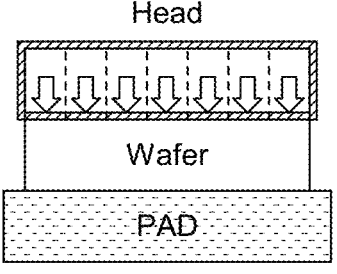
Figure 6:
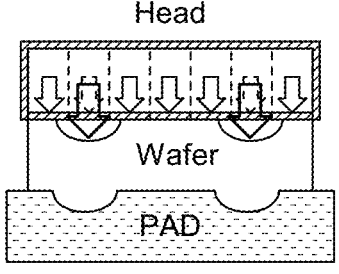
Figure 6:
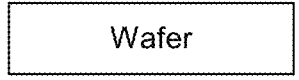
Figure 6:
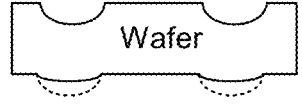

FIGS. 5A and 5B are each a graph illustrating the relationship between the nanotopography in a wafer plane and polishing amount (removal amount). FIG. 5A illustrates a case where a wafer is polished by the conventional pressurizing control system, and FIG. 5B illustrates a case where a wafer is polished by the pressurizing control system according to the present invention. In both the graphs of FIGS. 5A and 5B, the horizontal axis indicates a distance (mm) in the radial direction from the wafer center, the left vertical axis indicates a removal amount (nm), and the right vertical axis indicates nanotopography (nm).

As illustrated in FIG. 5A, in the wafer polishing method based on the conventional pressurizing control system, the nanotopography became as large as about 10 nm to the positive side (convex side) as viewed from the reference level at the wafer outer peripheral portion separated from the wafer center by ±125 mm or more, and the removal amount significantly increased with the increase in the nanotopography. In a range within ±100 mm from the wafer center, the removal amount was about 480 nm, while in a range at a distance of ±125 mm or more from the wafer center, the removal amount was about 500 nm at maximum.

On the other hand, as illustrated in FIG. 5B, in the wafer polishing method according to the pressurizing control system of the present invention, the nanotopography became as large as about 7 nm to the positive side (convex side) as viewed from the reference level at the wafer outer peripheral portion separated from the wafer center by ±125 mm or more; however, as a result of pressurizing control that reduced the polishing pressure in the pressure zone Z2 illustrated in FIG. 1 by about 10% from the polishing pressure in the conventional wafer polishing method, variation in the removal amount was reduced irrespective of the increase in the nanotopography. That is, in a range within ±50 mm from the wafer center, the removal amount was about 500 nm, while in a range at a distance of ±125 mm or more from the wafer center, the removal amount was about 495 nm at maximum. This reveals that the polishing method of the present invention can solve the problem of the conventional polishing method. Namely, it is possible to prevent wafer flatness degradation caused by an increase in the removal amount in a site having a large nanotopography value. The present invention cannot provide an improved nanotopography quality over the conventional ones but is very advantageous in terms of wafer flatness although improvement in nanotopography quality is a little sacrificed.

REFERENCE SIGNS LIST 1 wafer polishing apparatus
10 polishing head
11 rotary shaft
12 pressurization flange
14 retainer ring
15 support plate
16 membrane
18 membrane pressurization line
21 rotating platen
22 polishing pad
W wafer
Z1-Z7 pressure zones

What is claimed is:
1. A wafer polishing method of applying mirror polishing to a surface of a wafer using a wafer polishing apparatus provided with a multi-zone pressurizing polishing head having a wafer pressing surface divided into a plurality of pressure zones and capable of performing pressurizing control independently for each pressure zone, comprising:
   measuring a nanotopography map on the wafer surface;
   performing the mirror polishing by setting the polishing pressure of the polishing head against the wafer for each pressure zone based on a result of the measurement of the nanotopography map, wherein the performing the mirror polishing includes individually setting an air pressure applied to each of the plurality of pressure zones based on the result of the measurement of the nanotopography map; and controlling the polishing pressure such that a lower polishing pressure is applied to a site having a larger nanotopography value.

2. The wafer polishing method as claimed in claim 1, further comprising calculating the polishing pressure in each pressure zone from the measurement result of the nanotopography map and a conversion formula defining a relationship between a nanotopography size and an adequate polishing pressure against a wafer having the nanotopography.

3. The wafer polishing method as claimed in claim 1, further comprising calculating the polishing pressure in one pressure zone from an average value of a plurality of site nanotopographies belonging to the one pressure zone.

4. The wafer polishing method as claimed in claim 1, wherein the plurality of pressure zones is sectioned concentrically.

5. The wafer polishing method as claimed in claim 2, further comprising calculating the polishing pressure in one pressure zone from an average value of a plurality of site nanotopographies belonging to the one pressure zone.

6. The wafer polishing method as claimed in claim 2, wherein the plurality of pressure zones is sectioned concentrically.

7. The wafer polishing method as claimed in claim 3, wherein the plurality of pressure zones is sectioned concentrically.

8. The wafer polishing method as claimed in claim 5, wherein the plurality of pressure zones is sectioned concentrically.

9. The wafer polishing method as claimed in claim 2, wherein the conversion formula defines an inverse relationship between the nanotopography size and the adequate polishing pressure against the wafer having the nanotopography.

* * * * *